(12) United States Patent
Beaupré-Laflamme et al.

(10) Patent No.: US 11,846,806 B2
(45) Date of Patent: Dec. 19, 2023

(54) STRESS COMPENSATING PICK-UP TOOL

(71) Applicant: Ciena Corporation, Hanover, MD (US)

(72) Inventors: Raphael Beaupré-Laflamme, Quebec (CA); Simon Savard, Quebec (CA)

(73) Assignee: Ciena Corporation, Hanover, MD (US)

( * ) Notice: Subject to any disclaimer, the term of this patent is extended or adjusted under 35 U.S.C. 154(b) by 664 days.

(21) Appl. No.: 17/015,549

(22) Filed: Sep. 9, 2020

(65) Prior Publication Data
US 2022/0075117 A1 Mar. 10, 2022

(51) Int. Cl.
| B23P 19/00 | (2006.01) |
| G02B 6/13 | (2006.01) |
| B25J 15/00 | (2006.01) |
| B25J 15/06 | (2006.01) |
| H01L 23/00 | (2006.01) |

(52) U.S. Cl.
CPC ............ *G02B 6/13* (2013.01); *B25J 15/0028* (2013.01); *B25J 15/0616* (2013.01); *H01L 24/83* (2013.01); *H01L 2224/83121* (2013.01); *H01L 2224/83855* (2013.01); *H01L 2924/3511* (2013.01)

(58) Field of Classification Search
CPC ..... B25J 15/0028; B25J 15/0616; G02B 6/13; H01L 24/83; H01L 2224/83121; H01L 2224/83855; H01L 2924/3511
See application file for complete search history.

(56) References Cited

U.S. PATENT DOCUMENTS

| 4,861,087 | A  | * | 8/1989 | Park | B25J 15/0253 |
| | | | | | 294/119.1 |
| 9,914,214 | B1 | * | 3/2018 | Strauss | B25J 15/0206 |
| 11,298,818 | B2 | * | 4/2022 | Kawabata | B25J 15/0009 |
| 2017/0223881 | A1 | * | 8/2017 | Kubota | H05K 13/0404 |
| 2019/0168396 | A1 | * | 6/2019 | Leidenfrost | B25J 9/1697 |

OTHER PUBLICATIONS

Boyer et al., "Novel, high-throughput, fiber-to-chip assembly employing only off-the-shelf components", 2017 IEEE 67th Electronic Components and Technology Conference, pp. 1632-1639.

* cited by examiner

*Primary Examiner* — Paul D Kim
(74) *Attorney, Agent, or Firm* — Young Basile Hanlon & MacFarlane, P.C.

(57) ABSTRACT

A stress compensating pick-up tool for aligning a companion chip with a host chip includes a tool tip and an actuator. The tool tip holds the companion chip, and includes a first tip portion and a second tip portion. The actuator applies a force to the tool tip, wherein the force causes the first tip portion and the second tip portion to rotate in opposite directions with respect to one another to optically align a portion of the companion chip with a corresponding portion of the host chip.

15 Claims, 12 Drawing Sheets

STRESS COMPENSATING PICK-UP TOOL

TECHNICAL FIELD

This disclosure relates to a stress compensating pick-up tool.

BACKGROUND

Photonic integrated circuits (PICs) often include optical waveguides for transporting optical waves around a device and into and out of various photonic structures (e.g., splitters, modulators, interferometers, resonators, multimode interference (MMI) couplers, photodetectors, etc.). An optical waveguide is a photonic structure that confines and guides the propagation of an electromagnetic wave. Some electromagnetic waves have a spectrum that has a peak wavelength that falls in a particular range of optical wavelengths (e.g., between about 100 nm to about 1 mm, or some subrange thereof), also referred to as "optical waves," "light waves," or simply "light." These optical waveguides may be implemented, for example, by forming a core structure from a material having a higher refractive index (e.g., silicon, or silicon nitride) surrounded by a cladding (also called a "buffer") made of one or more materials (or air) that have a lower refractive index. For example, the core structure may be formed by the silicon layer over a buried oxide (BOX) layer (e.g., silicon dioxide) of a substrate, such as a silicon-on-insulator (SOI) wafer, while the cladding would be formed by the oxide of the BOX layer and the silicon dioxide deposited on top of the core structure. The cladding may in some cases be formed by a single lower-index material (or air), or by multiple different lower-index materials (or air). Air can act as cladding, for example, if a core material is deposited on top of a cladding material without another material being deposited on top of the core material, or if a core material is suspended above a substrate. Due to the tight tolerances for aligning waveguides in different PIC chips, deformation due to stress during processing of wafers can sometimes be an issue.

When manufacturing PICs, a foundry often uses one or more stress compensation layers (made of different materials) to "fight against" the natural stress in the wafer and to straighten the wafer back to a planar or flat surface. There are several limitations that may apply to some solutions for straightening the wafer. For example, some or all of the following limitations may apply to some solutions. The stress compensation layer is applied to the backside of the wafer prior to singulation and it is a guess on how a singulated die will bow once free from the wafer. The stress compensation layer is passive, meaning that the resulting bow or curvature of the singulated die cannot be finely corrected or adapted for during later assembly. The wafer thickness is adjusted using backside grinding, which removes the stress compensation layer or adds complexity to the wafer process flow. Some dicing methods (such as stealth dicing and other laser dicing techniques) require a specific wafer backside surface finish and are often not compatible with the stress compensation layer. The singulated die is "as-is" once it is singulated, so if the adhesive curing process or host chip cavity (when the singulated die is placed in a host chip) require a fine tuning of the curvature of the die to optically align them, it may not be possible with some passive pick-up tools.

SUMMARY

In one aspect, in general, a stress compensating pick-up tool for aligning a companion chip with a host chip includes a tool tip and an actuator. The tool tip holds the companion chip, and includes a first tip portion and a second tip portion. The actuator applies a force to the tool tip, wherein the force causes the first tip portion and the second tip portion to rotate in opposite directions with respect to one another to optically align a portion of the companion chip with a corresponding portion of the host chip.

Aspects can include one or more of the following features.

The stress compensating pick-up tool further comprises two vacuum tubes extending through the tool tip, wherein a vacuum connection is created via the vacuum tubes to hold the companion chip by the tool tip.

One vacuum tube extends through the first tip portion to hold one side of the companion chip; and the other vacuum tube extends through the second tip portion to hold an opposite side of the companion chip; whereby when the first tip portion and the second tip portion rotate in opposite directions with respect to one another, the companion chip is straightened.

The actuator is a piezoelectric actuator.

An amount of force applied by the actuator is based on optical alignment feedback received by the stress compensating pick-up tool from the host chip.

The optical alignment feedback includes insertion loss data.

When the portion of the companion chip is optically aligned with the corresponding portion of the host chip, the amount of force applied by the actuator is actively applied until the companion chip is affixed to the host chip.

The first tip portion and the second tip portion are connected by a flexible joint.

The stress compensating pick-up tool further comprises a segmented tool base located between the actuator and the tool tip, wherein the actuator applies the force to the segmented tool base which in turn applies the force to the tool tip.

The segmented tool base includes an upper portion; the actuator is adjacent to the upper portion; and the actuator applies a downward force to the segmented tool base, which in turn applies the force to the tool tip.

The stress compensating pick-up tool further comprises: a first tool body portion integrally formed with the first tip portion; and a second tool body portion integrally formed with the second tip portion; wherein the actuator is between the first tool body portion and the second tool body portion and the actuator applies an outward force with respect to a centerline of the stress compensating pick-up tool to apply the force to the tool tip.

The stress compensating pick-up tool further comprises a first tool body portion integrally formed with the first tip portion; a second tool body portion integrally formed with the second tip portion; and a pivot connecting the first tool body portion and the second tool body portion; wherein the actuator is between the first tool body portion and the second tool body portion and the actuator applies an outward force with respect to a centerline of the stress compensating pick-up tool to apply the force to the tool tip.

The portion of the companion chip comprises ends of at least three waveguides of the companion chip, and the corresponding portion of the host chip comprises ends of at least three waveguides of the host chip.

In another aspect, in general, a method for applying stress compensation for aligning a companion chip with a host chip includes performing an active alignment to finely align the companion chip with the host chip. Feedback is received from the host chip on whether the companion chip is optically aligned with the host chip. A pick-up tool is activated to apply a stress compensation force to the companion chip until the companion chip is optically aligned with the host chip. When the companion chip is optically aligned with the host chip, an adhesive is cured to affix the companion chip to the host chip while the pick-up tool actively applies the stress compensation force to the companion chip.

Aspects can include one or more of the following features.

The feedback includes insertion loss data.

The method further comprises: picking up the companion chip with the pick-up tool before performing the active alignment; and releasing the companion chip from the pick-up tool after the adhesive has cured.

Picking up the companion chip includes creating a vacuum connection between the pick-up tool and the companion chip; and releasing the companion chip includes turning off the vacuum connection between the pick-up tool and the companion chip.

The pick-up tool includes a first tip portion configured to hold one side of the companion chip and a second tip portion configured to hold an opposite side of the companion chip; and activating the pick-up tool includes applying the stress compensation force to rotate the first tip portion and the second tip portion in opposite directions with respect to one another to straighten the companion chip.

Activating the pick-up tool includes adjusting an amount of stress compensation force applied based on the feedback.

The method further comprises performing a passive alignment by initially moving the pick-up tool to coarsely align the companion chip with the host chip, the passive alignment performed before the active alignment.

In another aspect, in general, a stress compensated companion chip produced by a method. The method includes performing an active alignment to finely align the companion chip with a host chip. Feedback is received from the host chip on whether the companion chip is optically aligned with the host chip. A pick-up tool is activated to apply a stress compensation force to the companion chip until the companion chip is optically aligned with the host chip. When the companion chip is optically aligned with the host chip, an adhesive is cured to affix the companion chip to the host chip while the pick-up tool actively applies the stress compensation force to the companion chip.

Aspects can include one or more of the following features.

The companion chip being finely aligned with the host chip comprises ends of at least three waveguides of the companion chip being aligned with corresponding ends of at least three waveguides of the host chip.

The received feedback includes insertion loss data.

Aspects can have one or more of the following advantages.

In some systems including PICs, a companion chip is inserted into a host chip. To ensure that the light propagates from the host chip to the companion chip and from the companion chip to the host chip, the companion chip and the host chip need to be optically aligned. As noted above, if the wafer is bowed when the wafer is diced, the singulated dies also have either a concave or convex curvature. With this curvature, it can be difficult to optically align the companion chip (the singulated die) and the host chip.

Pre-adjustment of the curvature of the companion chip is useful for alignment and permits compensation for an expected amount of curvature. The expected amount of curvature is based on statistical sampling and may not be the same for any given chip. The end goal is for optical waveguides on the edges of the companion chip to match optical waveguides on corresponding edges of an etched cavity in the host chip where the companion chip is placed, even if the host chip has its own curvature. With a passive pick-up tool, the shape of the companion chip cannot be changed, and a different pick-up tool is needed for different companion chip shapes, which leads to a more complicated assembly process.

To affix the companion chip to the host chip, an adhesive is applied and cured. However, curing the adhesive often adds curvature to the companion chip, and the pick-up tool assists in compensating for this by holding the companion chip while the adhesive cures. But with a passive pick-up tool, there is no way to change the shape of the companion chip, so the curvature may be worsened during the adhesive cure.

Other features and advantages will become apparent from the following description, and from the figures and claims.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

A stress compensating pick-up tool for aligning a companion chip with a host chip includes a tool tip and an actuator. In some embodiments, the host chip and the companion chip are photonic integrated circuits (PICs) fabricated using silicon photonics (e.g., silicon-on-insulator), or other semiconductor manufacturing techniques (e.g., CMOS techniques). The tool tip holds the companion chip, and includes a first tip portion and a second tip portion. The actuator applies a force to the tool tip, wherein the force causes the first tip portion and the second tip portion to rotate in opposite directions with respect to one another to optically align a portion (e.g., ends of at least three waveguides) of the companion chip with corresponding portion (e.g., ends of at least three waveguides) of the host chip. In embodiments where the companion chip and the host chip have one or two waveguides, the optical alignment may be performed by physically moving the companion chip relative to the host chip, and the stress compensation performed by the pick-up tool may not be needed.

Figure 1A:
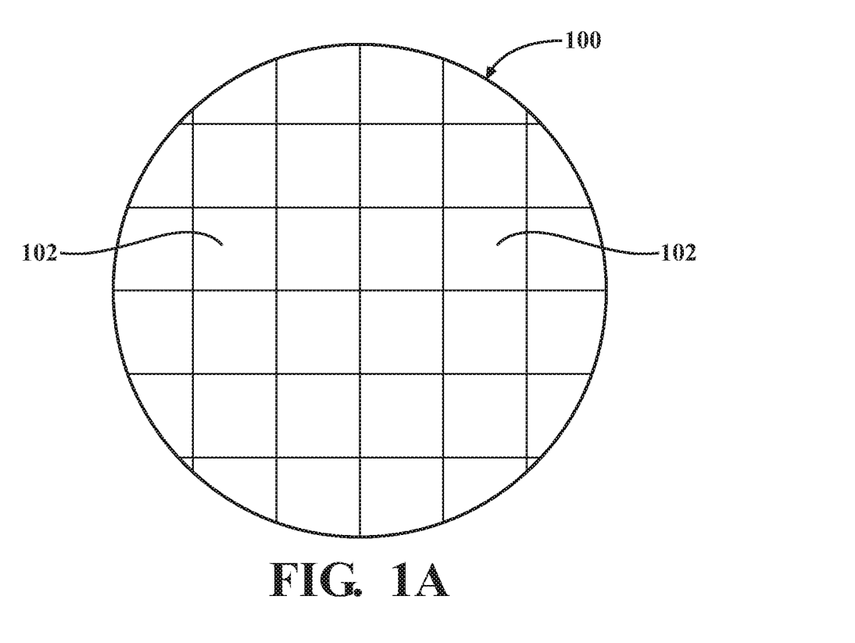
FIG. 1A is a top view of a wafer with a die grid.

FIG. 1A is a top view of a wafer 100 with a die grid, showing the individual dies 102.

Figure 1B:
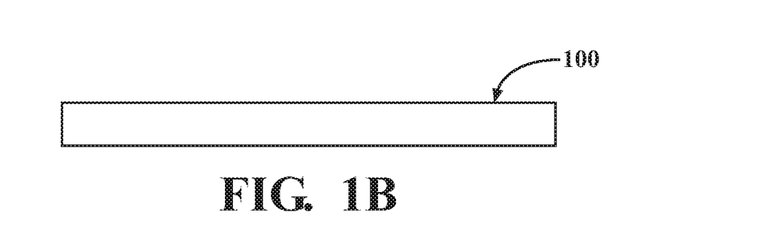
FIG. 1B is a side view of a flat wafer.

FIG. 1B is a side view of a flat wafer 100.

Figure 1C:
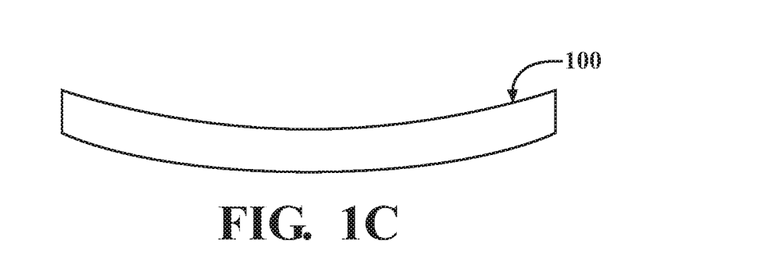
FIG. 1C is a side view of a curved wafer.

FIG. 1C is a side view of a curved wafer 100. In FIG. 1C, the wafer 100 has a concave curvature. In other wafers, the curvature is convex. The embodiments described herein are usable with dies having a concave curvature or a convex curvature.

Figure 1D:
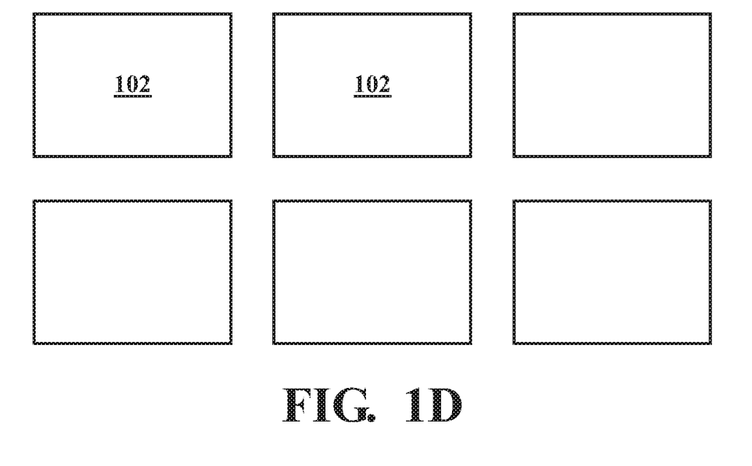
FIG. 1D is a top view of several singulated dies.

FIG. 1D is a top view of several singulated dies 102.

Figure 1E:
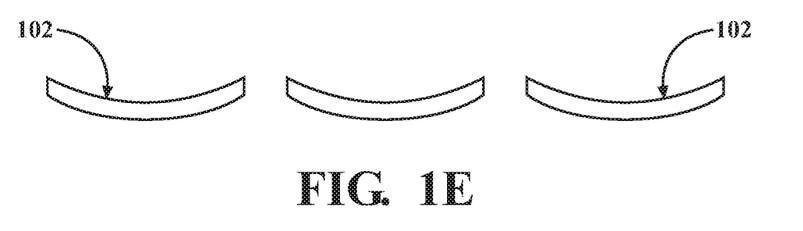
FIG. 1E is a side view of several singulated dies having a curvature.

FIG. 1E is a side view of several singulated dies 102, each having a curvature. Similar to the wafer 100, the individual dies 102 can have a concave curvature or a convex curvature. In some instances, each die 102 can have a bow (sagitta) of approximately 0.5-1.0 μm.

Figure 2:
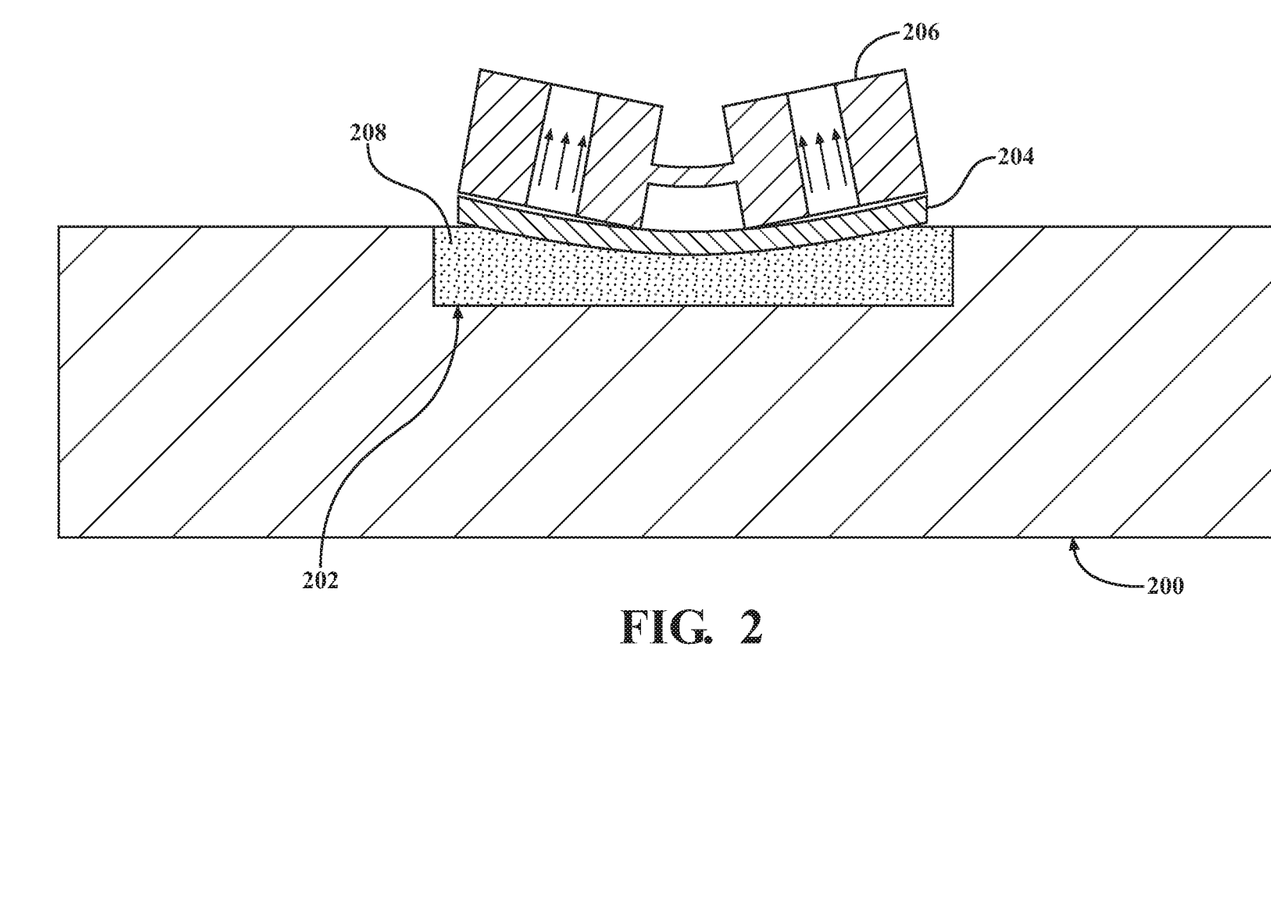
FIG. 2 is a side cross-sectional view of an existing passive pick-up tool placing a companion chip in a host chip.

FIG. 2 is a side cross-sectional view of an existing passive pick-up tool placing a companion chip in a host chip. A host chip 200 includes an etched cavity 202. A companion chip 204 is inserted into the etched cavity 202 by a pick-up tool 206. The pick-up tool 206 aligns the companion chip 204 in the etched cavity 202 of the host chip 200. Once the companion chip 204 is optically aligned with the host chip 200 in the etched cavity 202, the companion chip 204 is affixed to the host chip 200 by an adhesive 208. In an embodiment, the adhesive 208 is dispensed prior to the companion chip 204 being placed in the etched cavity 202. As shown in FIG. 2, the companion chip 204 has a concave bow, which is not corrected by the pick-up tool 206, thereby complicating the alignment process.

Figure 3A:
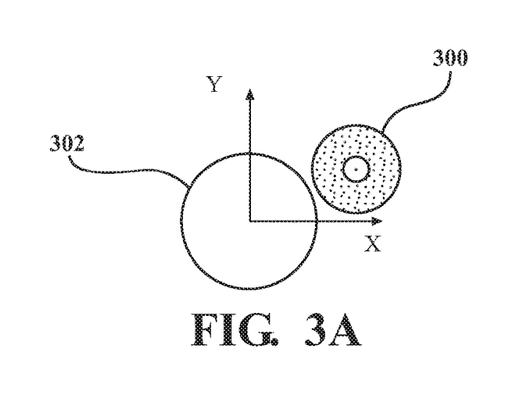
FIG. 3A is an end view of one waveguide in the companion chip and the host chip when the waveguides are misaligned.

FIG. 3A is an end view of one waveguide in the companion chip 300 and the host chip 302 when the waveguides are misaligned. As shown in FIG. 3A, the waveguides 300, 302 are misaligned in both the X and Y directions, but misalignment of the waveguides 300, 302 in any X-Y direction is possible.

Figure 3B:
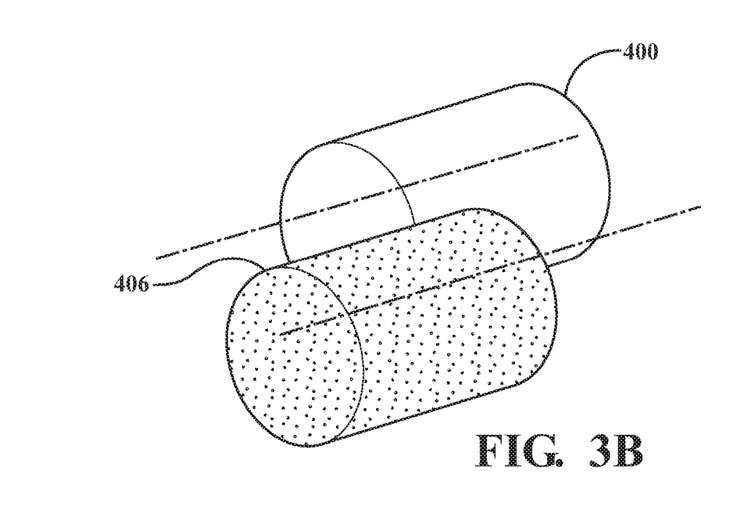
FIG. 3B is a side perspective view of one waveguide in the companion chip and the host chip when the waveguides are misaligned.

FIG. 3B is a side perspective view of one waveguide in the companion chip 300 and the host chip 302 when the waveguides are misaligned.

Figure 4:
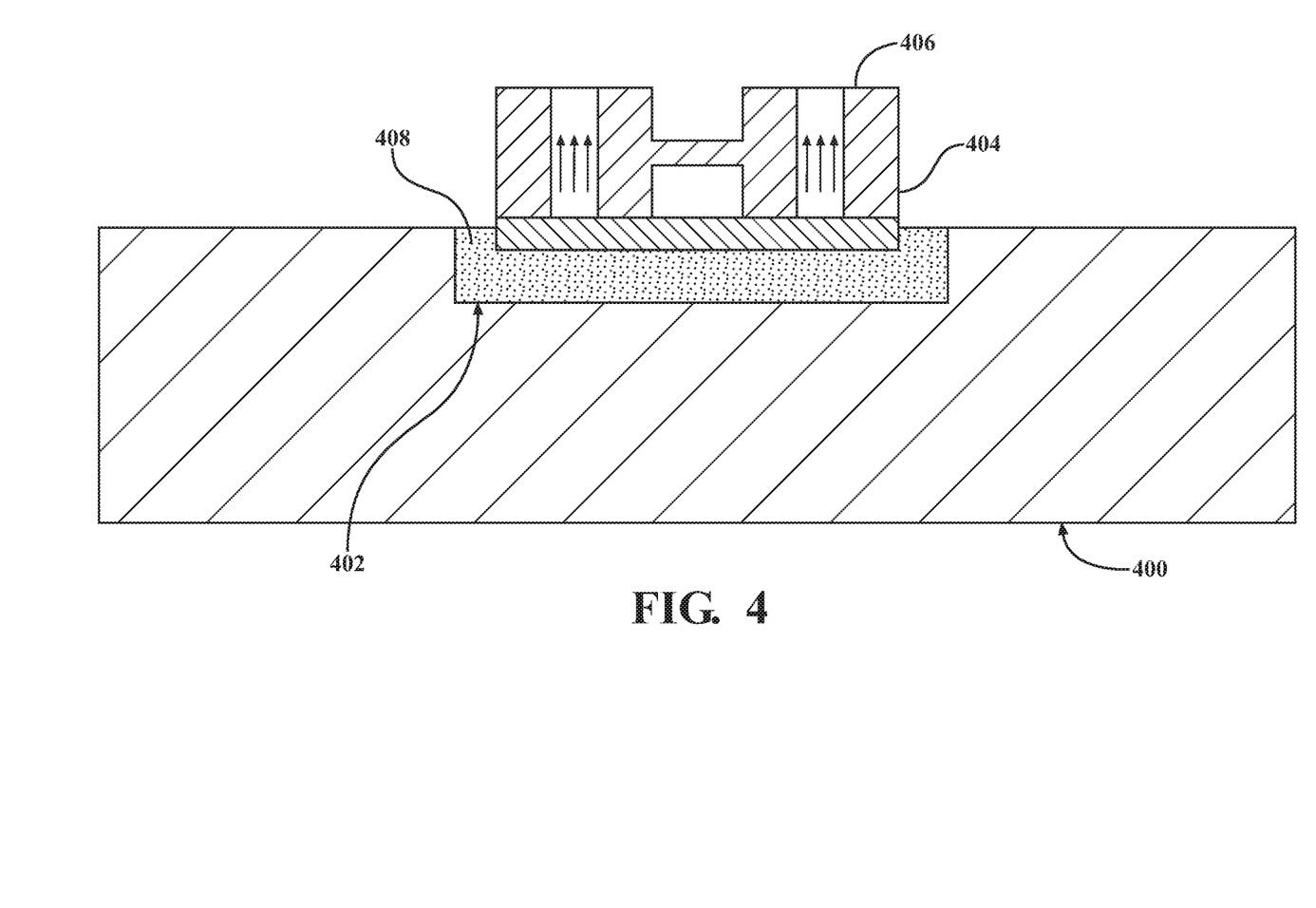
FIG. 4 is a side cross-sectional view of a companion chip inserted into a host chip after a stress compensating pick-up tool has been used.

FIG. 4 is a side cross-sectional view of a companion chip inserted into a host chip after a stress compensating pick-up tool has been used. A host chip 400 has an etched cavity 402. A companion chip 404 is held in place in the etched cavity 402 by a stress compensating pick-up tool 406. Once the companion chip 404 is optically aligned with the host chip 400 in the etched cavity 402, the companion chip 404 is affixed to the host chip 400 by an adhesive 408. In an embodiment, the adhesive 408 is dispensed prior to the companion chip 404 being placed in the etched cavity 402.

Figure 5A:
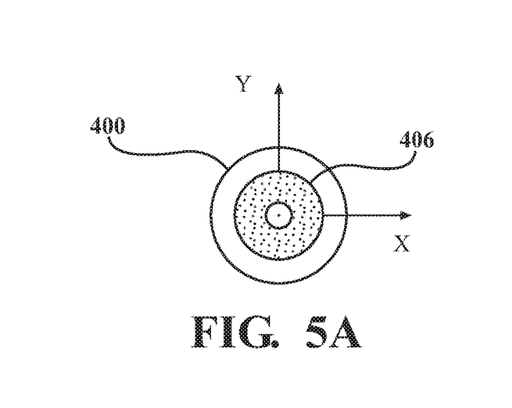
FIG. 5A is an end view of one waveguide in the host chip and the companion chip when the waveguides are aligned.

FIG. 5A is an end view of one waveguide in the host chip 400 and the companion chip 406 when the waveguides are aligned. As shown in FIG. 5A, the waveguides of the host chip 400 and the companion chip 406 are aligned in both the X and Y directions.

Figure 5B:
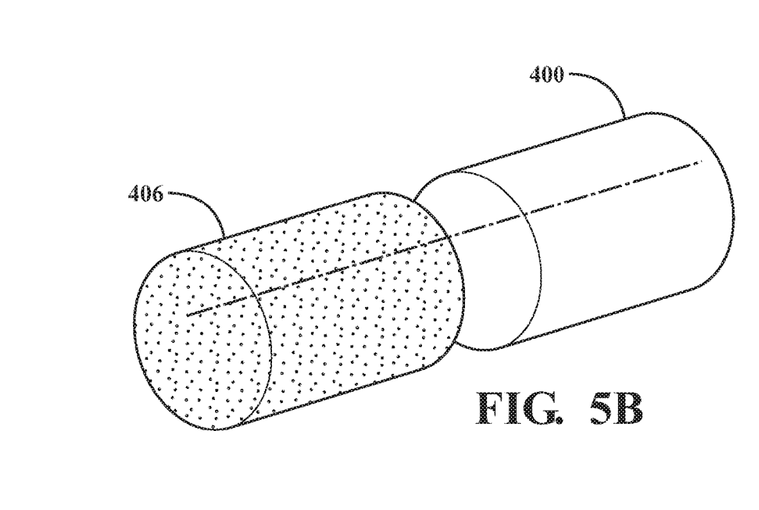
FIG. 5B is a side perspective view of one waveguide in the host chip and the companion chip when the waveguides are aligned.

FIG. 5B is a side perspective view of one waveguide in the host chip 400 and the companion chip 406 when the waveguides are aligned.

Figure 6A:
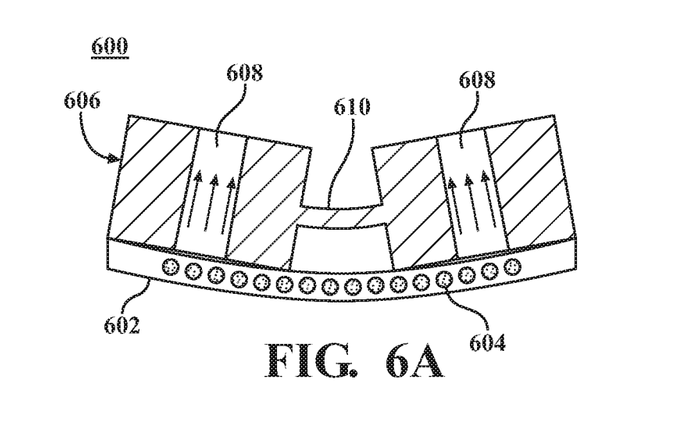
FIG. 6A is a side view of a stress compensating pick-up tool in an initial state.
Figure 6B:
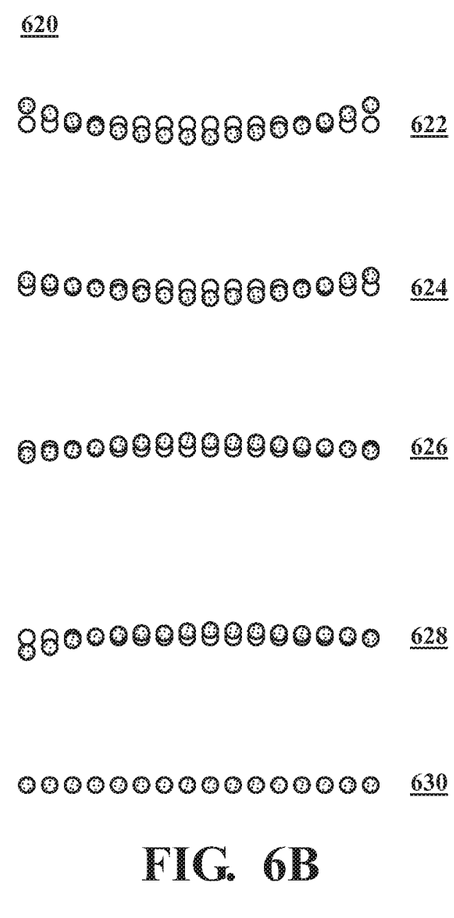
FIG. 6B are a series of end views of waveguides showing the alignment process as the stress compensating pick-up tool is operating.
Figure 6C:
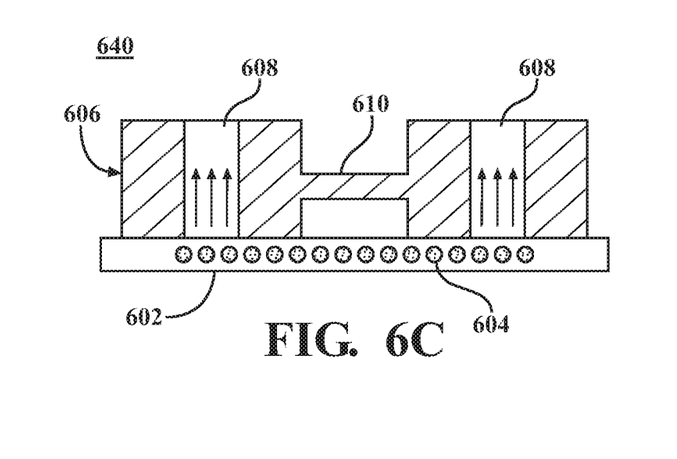
FIG. 6C is a side view of the stress compensating pick-up tool in a final state after the alignment process has completed.

FIGS. 6A-6C show an overview of how a stress compensating pick-up tool operates to adjust the curvature of a companion chip. It is noted that FIGS. 6A-6C generally describe a stress compensating pick-up tool, and some exemplary embodiments of the stress compensating pick-up tool are described in additional detail below.

FIG. 6A is a side view of a stress compensating pick-up tool in an initial state 600. In the initial state 600, a companion chip 602 having a plurality of waveguides 604 is held by a stress compensating pick-up tool 606. It is noted that the number of waveguides shown in FIG. 6A is one example, and that any number of waveguides may be used with the embodiments described herein. The ends of a plurality of waveguides 604 are spaced along a width of the companion chip 602. The pick-up tool 606 uses two vacuum ports 608 to hold the companion chip 602. The pick-up tool 606 has a flexible joint 610 such that the pick-up tool 606 can flex, to be able to pick up the companion chip 602 and to straighten the companion chip 602.

FIG. 6B are a series of end views 620 of waveguides showing the alignment process as the stress compensating pick-up tool 606 is operating. In an initial alignment phase 622, the companion chip 602 is roughly aligned with the host chip. As the pick-up tool 606 is flexed to straighten the companion chip 602, there are one or more intermediate alignment phases 624-628. While three intermediate alignment phases are shown in FIG. 6B, any number of intermediate alignment phases may be performed. The intermediate alignment phase is a continuous process in which the waveguides are checked for alignment as the pick-up tool 606 is flexed. The intermediate alignment phases 624-628 are snapshots in time of possible alignments during flexing the pick-up tool 606. A final alignment phase 630 is reached when the companion chip 602 is optically aligned with a host chip (the host chip is not shown in FIGS. 6A-6C). The phrase "optically aligned" is not required to be "perfectly" optically aligned, such that there is zero deviation from any waveguide. Depending on the tolerances (which may be adjusted for a particular companion chip/host chip combination), slight deviations in optical alignment may be acceptable.

FIG. 6C is a side view of the stress compensating pick-up tool 606 in a final state 640 after the alignment process has completed. Once the final alignment phase 630 has been reached, the pick-up tool 606 maintains that position while an adhesive is applied and cured, to ensure that the final alignment phase 630 is retained once the companion chip 602 is affixed to the host chip. After the companion chip 602 is affixed to the host chip, the vacuum connection is disengaged and the pick-up tool 606 releases the companion chip 602.

Figure 7A:
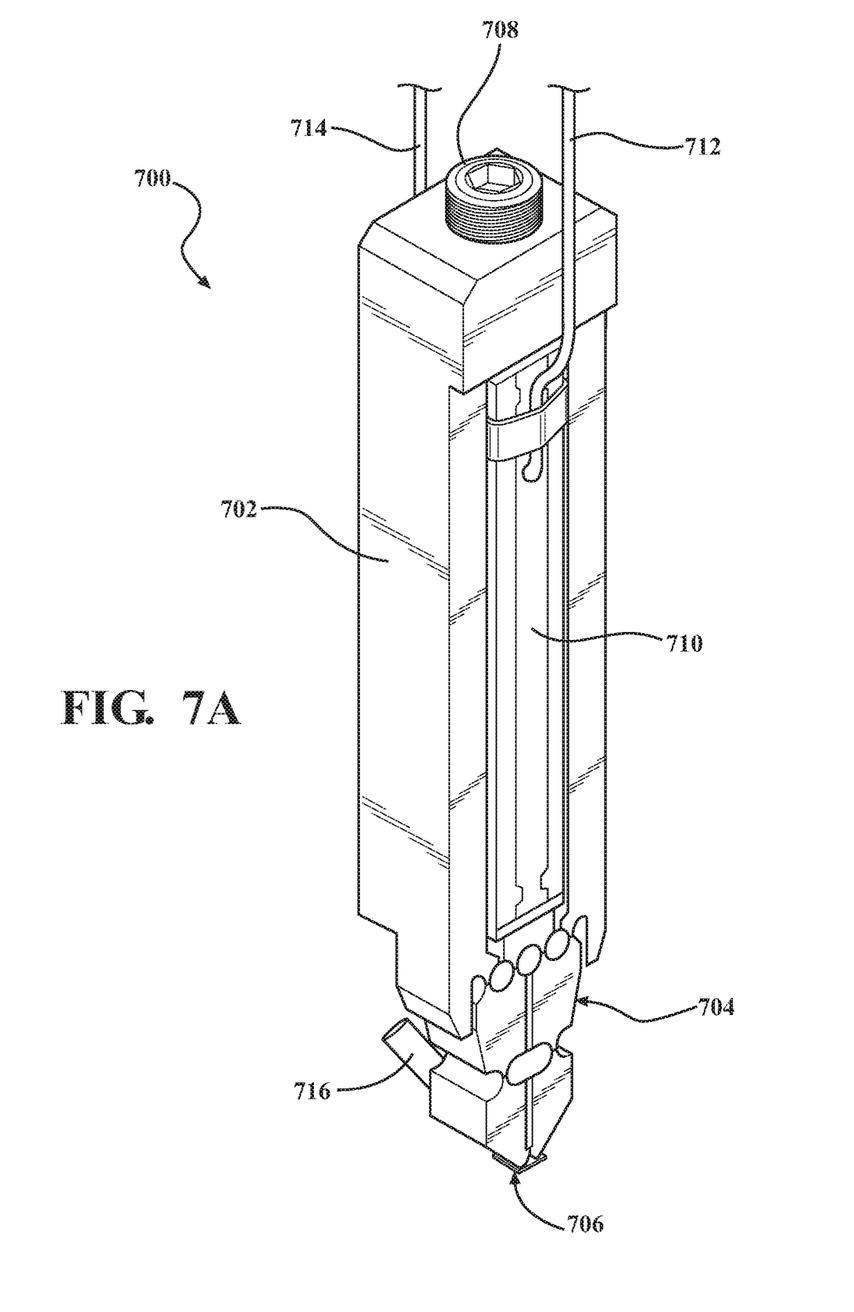
FIG. 7A is a perspective view of a first embodiment of a stress compensating pick-up tool.

FIG. 7A is a perspective view of a first embodiment of a stress compensating pick-up tool 700. The pick-up tool 700 includes a tool body 702, a tool base 704, and a tool tip 706. The tool 700 may be made from any sufficiently stiff material, for example stainless steel, Invar, or other material having a Young's modulus of approximately 100-225 gigapascals (GPa) or higher. The tool body 702 includes a tightening screw 708 and a piezoelectric actuator 710. The tightening screw 708 is used to "pre-load" the piezoelectric actuator 710. An electrical connection 712 provides power to the piezoelectric actuator 710, which in turn provides force to the tool base 704 and the tool tip 706 to adjust the curvature of a companion chip. While the embodiment is described as using a piezoelectric actuator 710, any suitable type of actuator may be used to provide force to the tool base 704 and the tool tip 706. A control wire 714 is used to control movement of the piezoelectric actuator 710. Two vacuum tubes 716 extend through the tool base 704 to the tool tip 706 (for clarity, only one vacuum tube 716 is shown in FIG. 7A). The vacuum tubes 716 provide a vacuum connection so the pick-up tool 700 can hold the companion chip at the tool tip 706 while the curvature of the companion chip is adjusted.

Figure 7B:
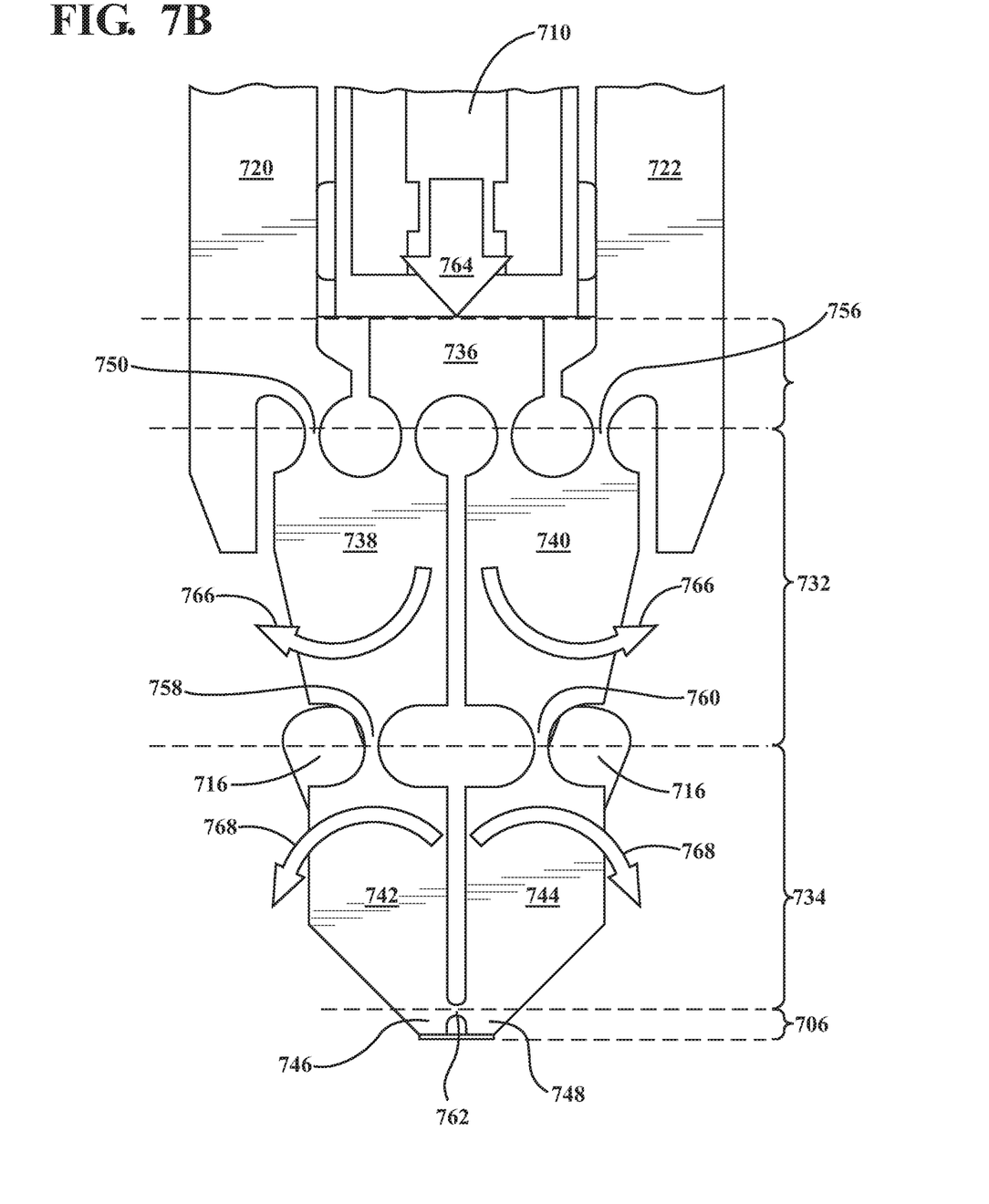
FIG. 7B is an enlarged front view of a portion of the stress compensating pick-up tool shown in FIG. 7A.

FIG. 7B is an enlarged front view of a portion of the stress compensating pick-up tool 700 shown in FIG. 7A. The tool body 702 includes a first tool body portion 720 and a second tool body portion 722. The tool base 704 is segmented and includes an upper tool base 730, a middle tool base 732, and a lower tool base 734. In FIG. 7B, upper tool base 730, middle tool base 732, lower tool base 734, and tool tip 706 are shown separated by dashed lines. The upper tool base 730 includes an upper tool base portion 736. The middle tool base 732 includes a first middle tool base portion 738 and a second middle tool base portion 740. The lower tool base 734 includes a first lower tool base portion 742 and a second lower tool base portion 744. The tool tip 706 includes a first tool tip portion 746 and a second tool tip portion 748.

The first tool body portion 720 is connected to the first middle tool base portion 738 by a flexible joint 750. The flexible joint 750 (and other flexible joints as described below) is made of thinner material than other portions of the pick-up tool 700 such that when a force is applied to the pick-up tool 700, the first tool body portion 720 and the first middle tool base portion 738 move in opposite directions with respect to one another. The upper tool base portion 736 is connected to the first middle tool base portion 738 by a flexible joint 752 and to the second middle tool base portion 740 by a flexible joint 754. The second tool body portion 722 is connected to the second middle tool base portion 740 by a flexible joint 756.

The first middle tool base portion 738 is connected to the first lower tool base portion 742 by a flexible joint 758. The second middle tool base portion 740 is connected to the second lower tool base portion 744 by a flexible joint 760.

The first lower tool base portion 742 is integrally formed with the first tool tip portion 746. The second lower tool base portion 744 is integrally formed with the second tool tip portion 748. The first tool tip portion 746 and the second tool tip portion 748 are connected by a flexible joint 762. The first tool tip portion 746 contacts one side of the companion chip and the second tool tip portion 748 contacts an opposite side of the companion chip when a vacuum pressure is applied via the vacuum tubes 716, such that the tool tip 706 holds the companion chip.

In operation, a vacuum connection is created via the vacuum tubes 716 for the tool tip 706 to hold the companion chip. The piezoelectric actuator 710 is activated, generating a downward force (indicated by arrow 764) on the upper tool base portion 736. This downward force causes the first middle tool base portion 738 and the second middle tool base portion 740 to deflect outward from a centerline of the pick-up tool 700 around the flexible joints 750, 752, 754, 756 (indicated by arrows 766). As the first middle tool base portion 738 and the second middle tool base portion 740 deflect outward, this force causes the first lower tool base portion 742 and the second lower tool base portion 744 to deflect outward from the centerline of the pick-up tool 700 around the flexible joints 758, 760 (indicated by arrows 768). As the first lower tool base portion 742 and the second lower tool base portion 744 deflect outward, the first tool tip portion 746 and the second tool tip portion 748 deflect outward around the flexible joint 762, applying a force to adjust the curvature of the companion chip.

Figure 8A:
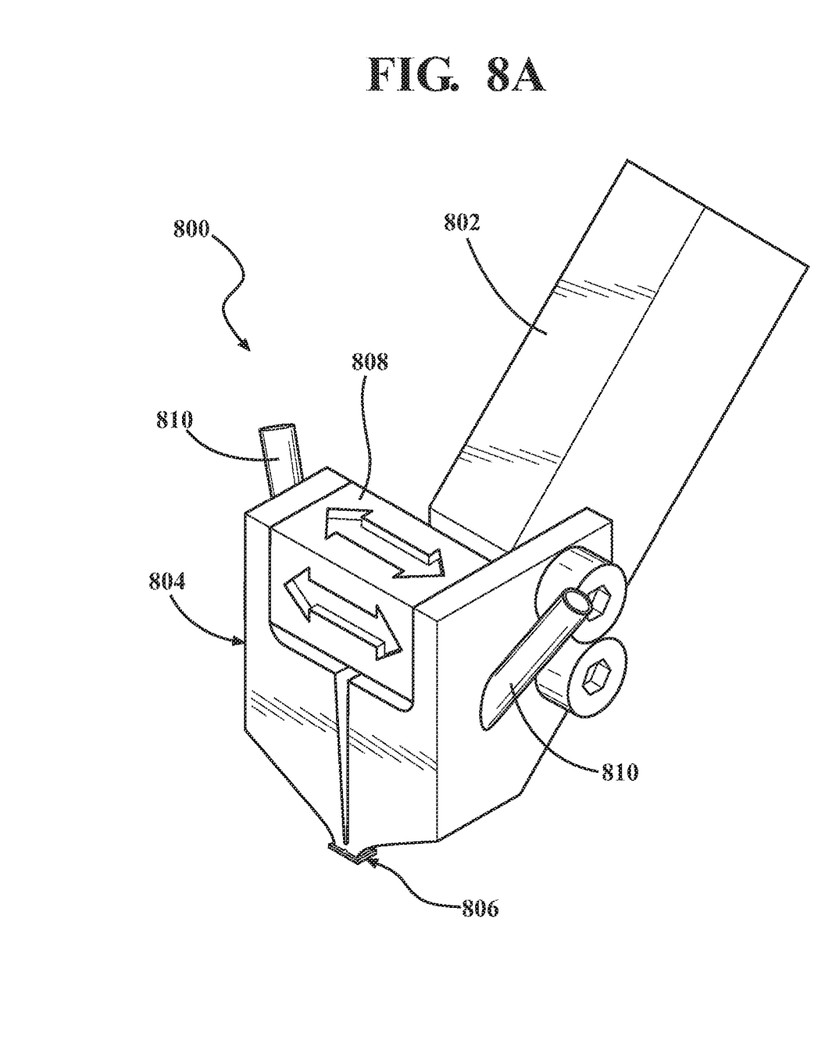
FIG. 8A is a perspective view of a second embodiment of a stress compensating pick-up tool.
Figure 8B:
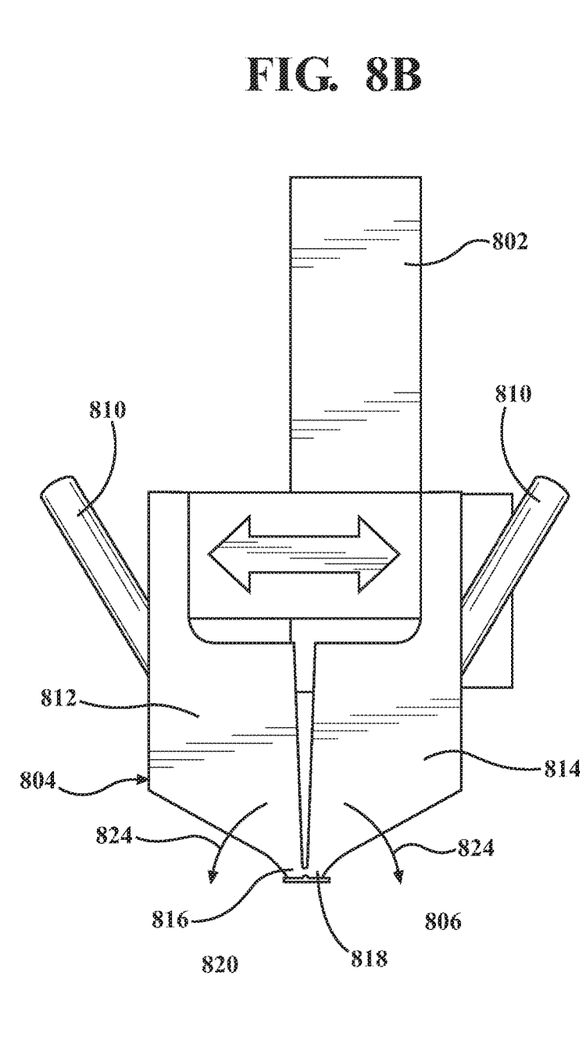
FIG. 8B is an enlarged front view of the stress compensating pick-up tool shown in FIG. 8A.

FIGS. 8A and 8B show a second embodiment of a stress compensating pick-up tool 800. The pick-up tool 800 includes a support structure 802, a tool body 804, and a tool tip 806. The tool 800 may be made from any sufficiently stiff material, for example stainless steel, Invar, or other material having a Young's modulus of approximately 100-225 gigapascals (GPa) or higher. The tool body 804 includes an actuator 808. Two vacuum tubes 810 extend through the tool body 804 to the tool tip 806. The vacuum tubes 810 provide a vacuum connection so the pick-up tool 800 can hold the companion chip at the tool tip 806 while the curvature of the companion chip is adjusted.

The tool body 804 includes a first tool body portion 812 and a second tool body portion 814. The actuator 808 is positioned between the first tool body portion 812 and the second tool body portion 814. The tool tip 806 includes a first tool tip portion 816 and a second tool tip portion 818. The first tool body portion 812 is integrally formed with the first tool tip portion 816. The second tool body portion 814 is integrally formed with the second tool tip portion 818. The first tool tip portion 816 and the second tool tip portion 818 are connected by a flexible joint 820. The flexible joint 820 is made of thinner material than other portions of the pick-up tool 800 such that when a force is applied to the pick-up tool 800, the first tool body portion 812 and the second tool body portion 814 move in opposite directions with respect to one another. Any suitable type of actuator 808 may be used, including, but not limited to, a piezoelectric actuator.

In operation, a vacuum connection is created via the vacuum tubes 810 for the tool tip 806 to hold the companion chip. The actuator 808 is activated, generating outward forces (with respect to a centerline of the pick-up tool 800, shown by arrow 822) to push the first tool body portion 812 and the second tool body portion 814 in opposite directions with respect to one another. This force causes the first tool tip portion 816 and the second tool tip portion 818 to deflect outward around the flexible joint 820 (shown by arrows 824), applying a force to adjust the curvature of the companion chip.

Figure 9A:
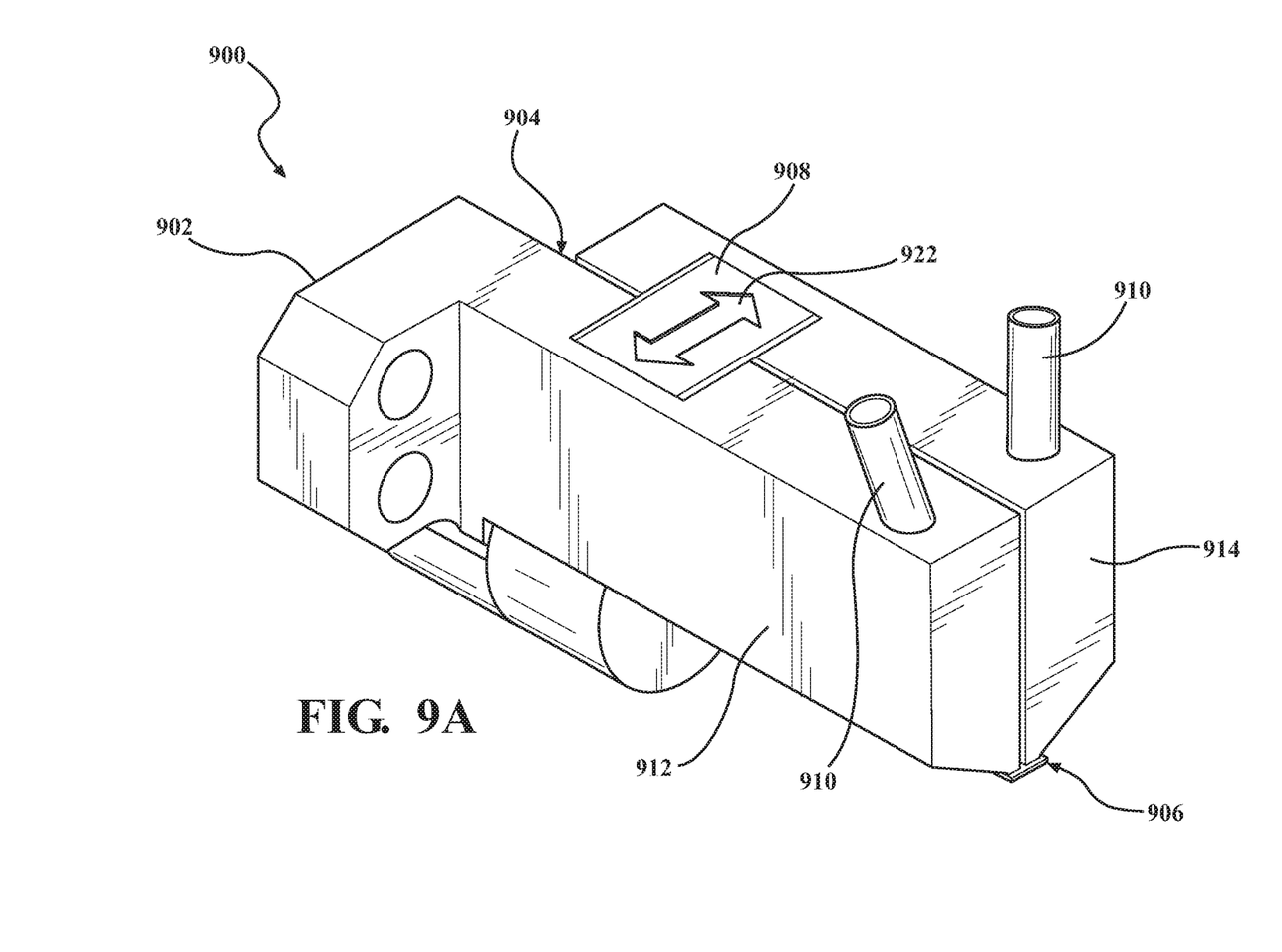
FIG. 9A is a top perspective view of a third embodiment of a stress compensating pick-up tool.
Figure 9B:
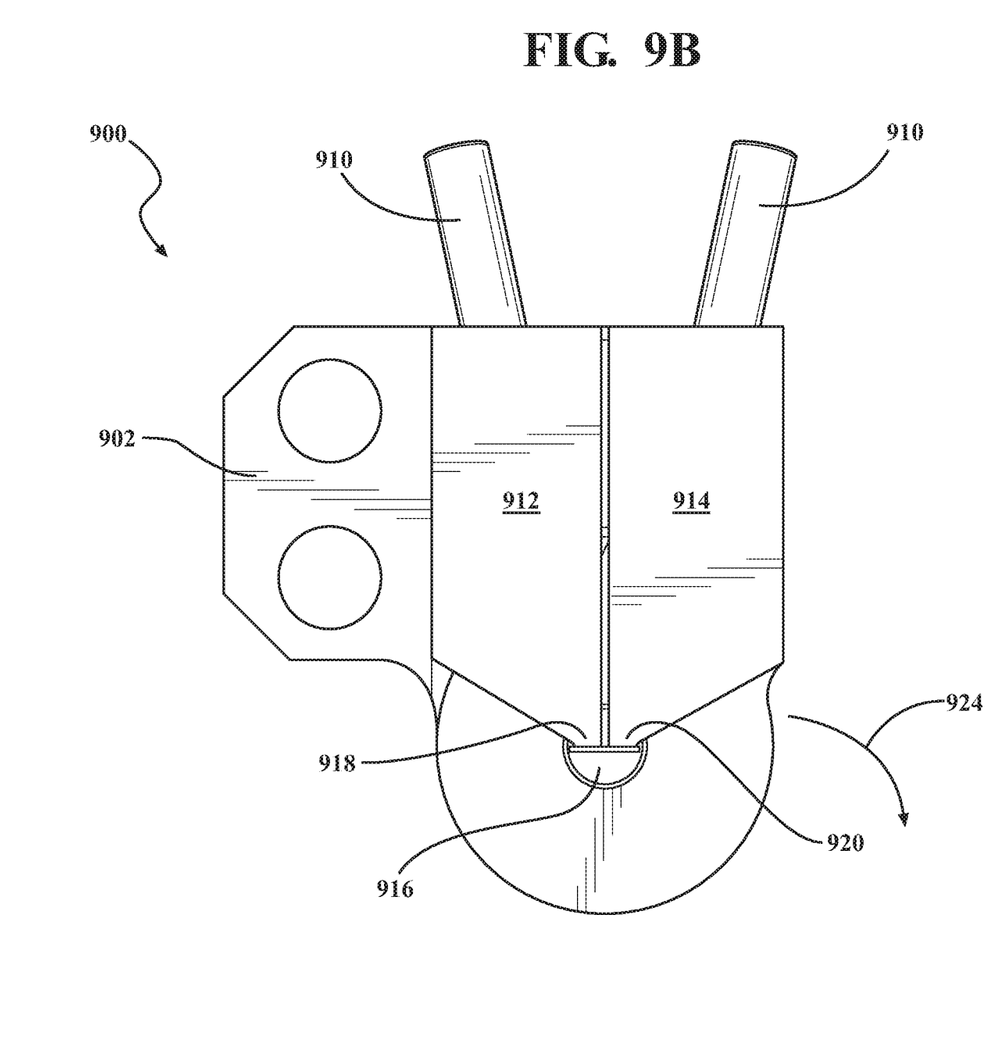
FIG. 9B is a front view of the stress compensating pick-up tool shown in FIG. 9A.

FIGS. 9A and 9B show a third embodiment of a stress compensating pick-up tool 900. The pick-up tool 900 includes a support structure 902, a tool body 904, and a tool tip 906. The tool 900 may be made from any sufficiently stiff material, for example stainless steel, Invar, or other material having a low coefficient of thermal expansion, for example, 20 ppm/C or less. The tool body 904 includes an actuator 908. Any suitable type of actuator 908 may be used, including, but not limited to, a piezoelectric actuator. Two vacuum tubes 910 extend through the tool body 904 to the tool tip 906. The vacuum tubes 910 provide a vacuum connection so the pick-up tool 900 can hold the companion chip at the tool tip 906 while the curvature of the companion chip is adjusted.

The tool body 904 includes a first tool body portion 912 and a second tool body portion 914 connected by a pivot 916. The support structure 902 is integrally formed with the first tool body portion 912. The actuator 908 is positioned between the first tool body portion 912 and the second tool body portion 914. The tool tip 906 includes a first tool tip portion 918 and a second tool tip portion 920. The first tool body portion 912 is integrally formed with the first tool tip portion 918. The second tool body portion 914 is integrally formed with the second tool tip portion 920.

In operation, a vacuum connection is created via the vacuum tubes 910 for the tool tip 906 to hold the companion chip. The actuator 908 is activated, generating outward forces (with respect to a centerline of the pick-up tool 900, shown by arrow 922) to push the second tool body portion 914 away from the first tool body portion 912 by rotating around the pivot 916 (shown by arrow 924). This force causes the second tool tip portion 920 to deflect away from the first tool tip portion 918, applying a force to adjust the curvature of the companion chip.

Figure 10:
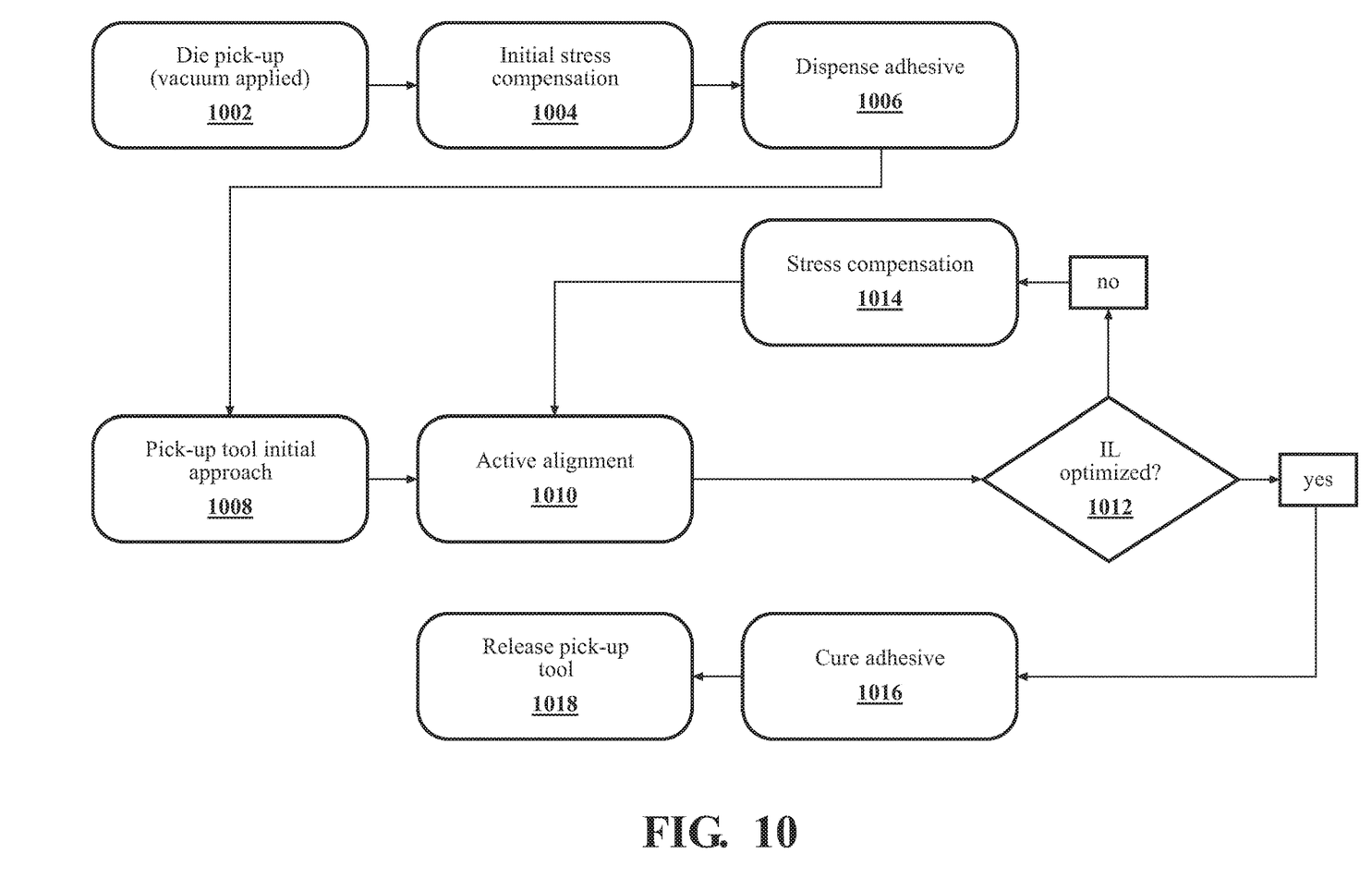
FIG. 10 is a flowchart of a method of a process flow using the stress compensating pick-up tool.

FIG. 10 is a flowchart of a method 1000 of a process flow using a stress compensating pick-up tool. The method 1000 begins with a die pick-up operation (operation 1002). In the die pick-up operation, the pick-up tool is positioned over the companion chip, a vacuum connection is created so that the pick-up tool picks up the companion chip, and the pick-up tool is raised to move the companion chip into position in a host chip. Based on a static measurement of the companion chip, the pick-up tool is activated (via an actuator) to apply an initial stress compensation (operation 1004). In operation 1004, based on known (or assumed, based on a statistical sampling) curvature of the companion chip, the pick-up tool applies the initial stress compensation.

The adhesive is dispensed in an etched cavity in the host chip (operation 1006). In an embodiment, the adhesive is dispensed prior to the companion chip being lowered, because it may be difficult to properly dispense the adhesive with the companion chip in place. The pick-up tool is lowered, to place the companion chip in the etched cavity in the host chip (operation 1008).

Active alignment begins, using optical feedback from the companion chip and the host chip (operation 1010). In an embodiment, this feedback includes insertion loss data from waveguides in the companion chip and in the host chip. If the insertion loss (IL) is not optimized (operation 1012, "no" branch), then the pick-up tool applies stress compensation based on the feedback received, by using the actuator to activate the pick-up tool (operation 1014). The pick-up tool physically changes the shape of the companion chip, thus compensating for the stress or correcting misalignment of optical inputs. The stress compensation in operations 1010-1014 is performed until the companion chip and the host chip are optically aligned (when the insertion loss is optimized; operation 1012, "yes" branch). The phrase "optically aligned" is not required to be "perfectly" optically aligned, such that there is zero deviation from any waveguide. Depending on the tolerances (which may be adjusted for a particular companion chip/host chip combination), slight deviations in optical alignment may be acceptable.

When the companion chip and the host chip are optically aligned, the adhesive is cured while the pick-up tool holds the companion chip in optical alignment with the host chip (operation 1016). Once the adhesive is cured, the actuator is relaxed and the vacuum connection is turned off, releasing the pick-up tool from the companion chip (operation 1018). The pick-up tool then returns to its "home" position.

In an embodiment, the companion chip and the host chip may be connected in a "butt coupling" manner, where one side edge of the companion chip is connected to a corresponding side edge of the host chip.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A stress compensating pick-up tool for aligning a companion chip with a host chip, the pick-up tool comprising:
  a tool tip configured to hold the companion chip, the tool tip including a first tip portion and a second tip portion; and
  an actuator configured to apply a force to the tool tip, wherein the force causes the first tip portion and the second tip portion to rotate in opposite directions with respect to one another while the first tip portion and the second tip portion are directly connected to each other by a first flexible joint to straighten a portion of the companion chip and optically align the portion of the companion chip with a corresponding portion of the host chip.

2. The stress compensating pick-up tool of claim 1, further comprising
  two vacuum tubes extending through the tool tip, wherein a vacuum connection is created via the vacuum tubes to hold the companion chip by the tool tip.

3. The stress compensating pick-up tool of claim 2, wherein
  one vacuum tube extends through the first tip portion to hold one side of the companion chip; and
  the other vacuum tube extends through the second tip portion to hold an opposite side of the companion chip;
  whereby when the first tip portion and the second tip portion rotate in opposite directions with respect to one another, the companion chip is straightened.

4. The stress compensating pick-up tool of claim 1, wherein the actuator is configured to apply an amount of force based on optical alignment feedback received by the stress compensating pick-up tool from the host chip.

5. The stress compensating pick-up tool of claim 4, wherein when the portion of the companion chip is optically aligned with the corresponding portion of the host chip, the actuator is configured to actively apply the amount of force until the companion chip is affixed to the host chip.

6. The stress compensating pick-up tool of claim 1, further comprising
  a segmented tool base located between the actuator and the tool tip, wherein the actuator is configured to apply the force to the segmented tool base which in turn applies the force to the tool tip to cause the first tip portion and the second tip portion to rotate in opposite directions with respect to one another.

7. The stress compensating pick-up tool of claim 6, wherein
  the segmented tool base includes an upper portion, a first middle portion, and a second middle portion;
  the actuator is adjacent to the upper portion of the segmented tool base; and
  the actuator is configured to apply a downward force to the upper portion of the segmented tool base, which in turn applies the force to the first middle portion and the second middle portion to cause the first middle portion and the second middle portion rotate in opposite directions with respect to one another, which in turn applies the force to the tool tip to cause the first tip portion and the second tip portion to rotate in opposite directions with respect to one another.

8. The stress compensating pick-up tool of claim 7, wherein the first middle portion is directly connected to a first lower portion of the segmented tool base that is integrally formed with the first tip portion by a second flexible joint, and the second middle portion is directly connected to a second lower portion of the segmented tool base that is integrally formed with the second tip portion by a third flexible joint.

9. A stress compensating pick-up tool for aligning a companion chip with a host chip, the pick-up tool comprising:
   a tool tip configured to hold the companion chip, the tool tip including a first tip portion and a second tip portion;
   an actuator configured to apply a force to the tool tip, wherein the force causes the first tip portion and the second tip portion to rotate in opposite directions with respect to one another to straighten a portion of the companion chip and optically align the portion of the companion chip with a corresponding portion of the host chip;
   a first tool body portion integrally formed with the first tip portion;
   a second tool body portion integrally formed with the second tip portion; and
   a pivot connecting the first tool body portion and the second tool body portion;
   wherein the actuator is between the first tool body portion and the second tool body portion and the actuator is configured to apply an outward force with respect to a centerline of the stress compensating pick-up tool to apply the force to the tool tip to cause the first tip portion and the second tip portion to rotate in opposite directions with respect to one another.

10. The stress compensating pick-up tool of claim 9, further comprising
    two vacuum tubes extending through the tool tip, wherein a vacuum connection is created via the vacuum tubes to hold the companion chip by the tool tip.

11. The stress compensating pick-up tool of claim 10, wherein
   one vacuum tube extends through the first tip portion to hold one side of the companion chip; and
   the other vacuum tube extends through the second tip portion to hold an opposite side of the companion chip;
   whereby when the first tip portion and the second tip portion rotate in opposite directions with respect to one another, the companion chip is straightened.

12. The stress compensating pick-up tool of claim 9, wherein the actuator is configured to apply an amount of force based on optical alignment feedback received by the stress compensating pick-up tool from the host chip.

13. The stress compensating pick-up tool of claim 12, wherein when the portion of the companion chip is optically aligned with the corresponding portion of the host chip, the actuator is configured to actively apply the amount of force until the companion chip is affixed to the host chip.

14. The stress compensating pick-up tool of claim 12, wherein the portion of the companion chip comprises ends of a first set of at least three waveguides of the companion chip, the corresponding portion of the host chip comprises ends of a second set of at least three waveguides of the host chip, and the stress compensating pick-up tool is configured to receive the optical alignment feedback comprising optical insertion loss data based on insertion of a plurality of optical inputs inserted between respective pairs of waveguides including a first optical input inserted between a first waveguide of the first set and a first waveguide of the second set and a second optical input inserted between a second waveguide of the first set and a second waveguide of the second set.

15. The stress compensating pick-up tool of claim 4, wherein the portion of the companion chip comprises ends of a first set of at least three waveguides of the companion chip, the corresponding portion of the host chip comprises ends of a second set of at least three waveguides of the host chip, and the stress compensating pick-up tool is configured to receive the optical alignment feedback comprising optical insertion loss data based on insertion of a plurality of optical inputs inserted between respective pairs of waveguides including a first optical input inserted between a first waveguide of the first set and a first waveguide of the second set and a second optical input inserted between a second waveguide of the first set and a second waveguide of the second set.

* * * * *